(12) United States Patent
Seppä et al.

(10) Patent No.: US 6,657,442 B1
(45) Date of Patent: Dec. 2, 2003

(54) MICROMECHANICAL ALTERNATING AND DIRECT VOLTAGE REFERENCE APPARATUS

(75) Inventors: Heikki Seppä, Helsinki (FI); Aarne Oja, Espoo (FI); Mika Suhonen, Helsinki (FI)

(73) Assignee: Valtion teknillinen tutkimuskeskus, VTT (FI)

( * ) Notice: Subject to any disclaimer, the term of this patent is extended or adjusted under 35 U.S.C. 154(b) by 0 days.

(21) Appl. No.: 09/720,459

(22) PCT Filed: Jun. 22, 1999

(86) PCT No.: PCT/FI99/00553

§ 371 (c)(1),
(2), (4) Date: Dec. 22, 2000

(87) PCT Pub. No.: WO00/02110

PCT Pub. Date: Jan. 13, 2000

(30) Foreign Application Priority Data

Jun. 24, 1998 (FI) .................................................. 981457

(51) Int. Cl.$^7$ .............................................. G01R 27/26
(52) U.S. Cl. ...................................... 324/661; 324/98
(58) Field of Search ................................. 324/661, 658, 324/649, 652, 667, 668, 98, 99, 100, 102; 371/278, 290, 299.1; 333/186

(56) References Cited

U.S. PATENT DOCUMENTS

| 4,786,859 | A | * | 11/1988 | Arseneau et al. ............. 324/98 |
| 5,455,547 | A | * | 10/1995 | Lin et al. ...................... 333/186 |
| 5,491,604 | A | * | 2/1996 | Nguyen et al. ............. 361/278 |
| 5,659,262 | A | | 8/1997 | Memishian |
| 5,814,554 | A | | 9/1998 | De Samber et al. |
| 5,914,553 | A | | 6/1999 | Adams et al. |

FOREIGN PATENT DOCUMENTS

WO    WO94 14176    6/1994

* cited by examiner

Primary Examiner—N. Le
Assistant Examiner—T. R. Sundaram
(74) Attorney, Agent, or Firm—Birch, Stewart, Kolasch & Birch, LLP

(57) ABSTRACT

An AC/DC voltage reference system has at least one micromechanically fabricated electrode pair having first and second electrodes facing each other so that the electrodes are disposed at a distance from each other, whereby at least one of the electrodes is movable against a spring force. An AC signal is applied over the electrodes to establish an electrostatic force at a frequency substantially higher than the effective mechanical resonant frequency of the movable electrode. The system further includes an apparatus for detecting the AC voltage applied between the electrodes, thus forming an AC voltage reference.

9 Claims, 5 Drawing Sheets

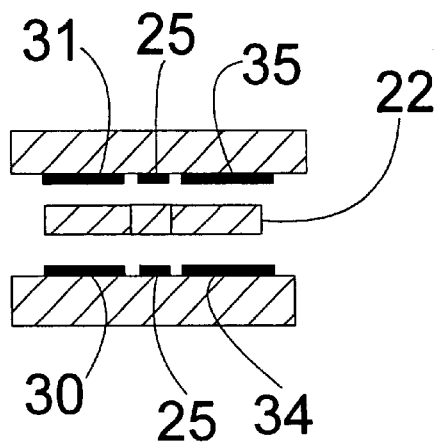
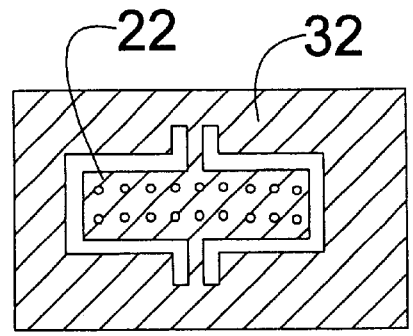
Fig. 5              Fig. 6
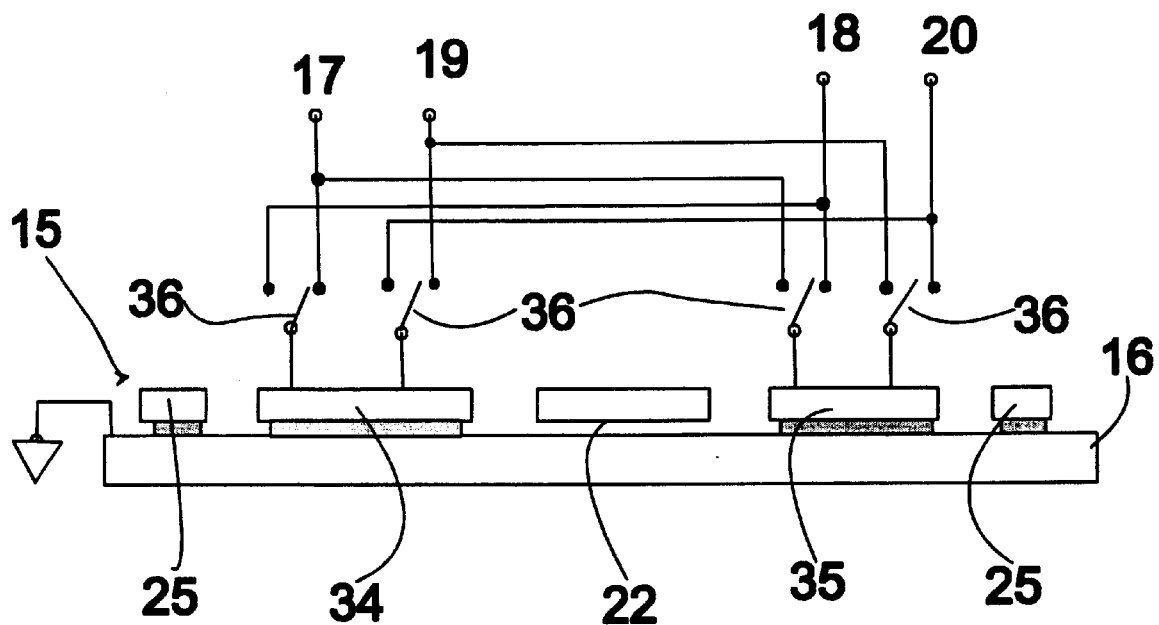
Fig. 7

MICROMECHANICAL ALTERNATING AND DIRECT VOLTAGE REFERENCE APPARATUS

This application is the national phase under 35 U.S.C. §371 of PCT International Application No. PCT/FI99/00553 which has an International filing date of Jun. 22, 1999, which designated the United States of America.

BACKGROUND OF THE INVENTION

1. Field of the Invention

The invention relates to a micromechanical AC voltage reference system.

The invention also concerns a micromechanical DC voltage reference system.

The invention further concerns an AC/DC converter based on an identical mechanical structure.

Possibilities of linking electrical quantities to mechanical quantities by means of a linear capacitive voltage transducer are contemplated, e.g., in a reference publication "F. Cabiati, "Linking Electrical With Mechanical Quantities Through Electro-Mechanical Resonance," in Conference Digest of CPEM96, pp. 610–611, 1996". These investigations have been performed into large electromechanical structures subject to mechanical instability factors and requiring a high bias voltage for operation.

It is a primary application of an AC/DC converter to measure the RMS value of an AC signal using a known DC signal as the reference. The most accurate state-of-the-art AC/DC converters are electrothermic transfer standards based on the comparison of ohmic heating caused by the applied AC and DC signals, respectively. One disadvantage of electrothermic converters is that they impose a heavy load on the signal source connected to their input.

A problem hampering fully electronic AC/DC converters is their relatively low maximum operating frequency and the resulting degradation of accuracy.

AC/DC converters may also be realized using micromechanical electrode structures operating based on an electrostatic force. The use of a silicon micromechanical capacitive electrode structure in the RMS amplitude measurement of an AC voltage signal is discussed in reference publication by "B. P. van Drieënhuizen and R. F. Wolffenbuttel, entitled "Integrated Micromachined Electrostatic True RMS-to-DC Converter," in IEEE Transactions on Instrumentation and Measurement, Vol. 44, No. 2, pp. 370–373, 1995". The publication describes a bridge structure made from polycrystalline silicon by surface micromechanical techniques. The structure includes an electrode pair in which one electrode is elastically suspended. An AC voltage applied between the electrodes causes a change in the interelectrode capacitance, the magnitude of which is measured to determine the RMS value of the applied AC voltage. According to this publication, the conversion of the measured capacitance into the respective AC RMS voltage was made using an electronic circuit. Hence, the accuracy of the AC RMS voltage measurement is dependent not only on the qualities of the micromechanical structure, but also on those of the above-mentioned electronic circuit used.

SUMMARY OF THE INVENTION

It is an object of the present invention to overcome the disadvantages of the above-described prior art techniques and to provide an entirely novel type of micromechanical AC and DC voltage reference system.

Furthermore, the invention disclosed herein is free from the shortcomings of the above-described micromechanically constructed AC/DC converter based on the measurement of an electrostatic force.

The goal of the invention is achieved by virtue of a system based on a micromechanical structure comprising at least one electrode pair that further comprises a first electrode and a second electrode disposed at a distance from each other so as to make at least one of said electrodes movable against a spring force, said system further including means for applying an AC signal over said electrodes for establishing an electrostatic force advantageously at a frequency which is substantially higher than the effective mechanical resonant frequency of the movable electrode and said system further including means for detecting the AC voltage acting over the electrodes thus creating the AC voltage reference. In an AC/DC converter based on a preferred embodiment of the bridge structure according to the invention, the electrostatic forces created by the AC signal and the DC signal are compared directly with each other using an embodiment of the micromechanical electrode structure. The electrical circuit measuring the capacitive voltage division ratio senses the force balance.

More specifically, the AC voltage standard according to the present invention is a system that comprises at least one micromechanically fabricated electrode pair. The pair includes a first electrode and a second electrode adapted to face each other so that the electrodes are disposed at a distance from each other, so that at least one of the electrodes is movable against a spring force. Means are provided for applying an AC signal over the electrodes for establishing an electrostatic force advantageously at a frequency substantially higher than the effective mechanical resonant frequency of the movable electrode. The system also includes an apparatus for detecting the AC voltage applied between said electrodes, thus forming an AC voltage reference.

Furthermore, the DC voltage standard according to the present invention comprises at least one micromechanically fabricated electrode pair. The electrode pair includes first and second electrodes facing each other so that the electrodes are disposed at a distance from each other, and at least one of the electrodes is movable against a spring force. Means are provided for applying an electrical charge between the electrodes in order to deviate the electrodes from their mutual equilibrium position, together with means for detecting the DC voltage applied between the electrodes, thus forming an DC voltage reference.

Still further, the AC/DC voltage transfer standard system, that is, an AC/DC converter, according to the present invention, comprises at least two micromechanically fabricated electrode pairs disposed at a distance from each other so that at least one of the electrodes is movable against a spring force. Means are provided for feeding a DC signal on one electrode of the first electrode pair. Also included are means for feeding an AC signal on one electrode of the second electrode pair, as well as means for detecting the position of the movable electrode or, alternatively, the force required to maintain the position of the electrode, to compare the RMS values of the applied AC and DC voltages.

The invention offers significant benefits.

Voltage standards according to the invention based on the advantageous mechanical and geometrical properties of monocrystalline silicon can exhibit an extremely high stability. Also the production costs of such voltage standards can be brought to a very reasonable level.

As the electronic circuit of an AC/DC converter according to a preferred embodiment of the invention essentially acts as a zero-position indicator, the problems occurring from, e.g., nonlinearities of electronics are avoided and thus an entirely novel type of AD/DC converter is accomplished.

DESCRIPTION OF THE DRAWINGS

In the following, the invention will be examined in greater detail with the help of exemplifying embodiments illustrated in the appended drawings, in which

FIG. 5 shows a cross-sectional view of an alternative embodiment according to the invention;

FIG. 6 shows the embodiment illustrated in FIG. 5, here sectioned in the plane of the beam element 22;

FIG. 7 shows a circuit configuration suitable for use in conjunction with the embodiment illustrated in FIG. 4;

DESCRIPTION OF THE INVENTION

Figure 1:
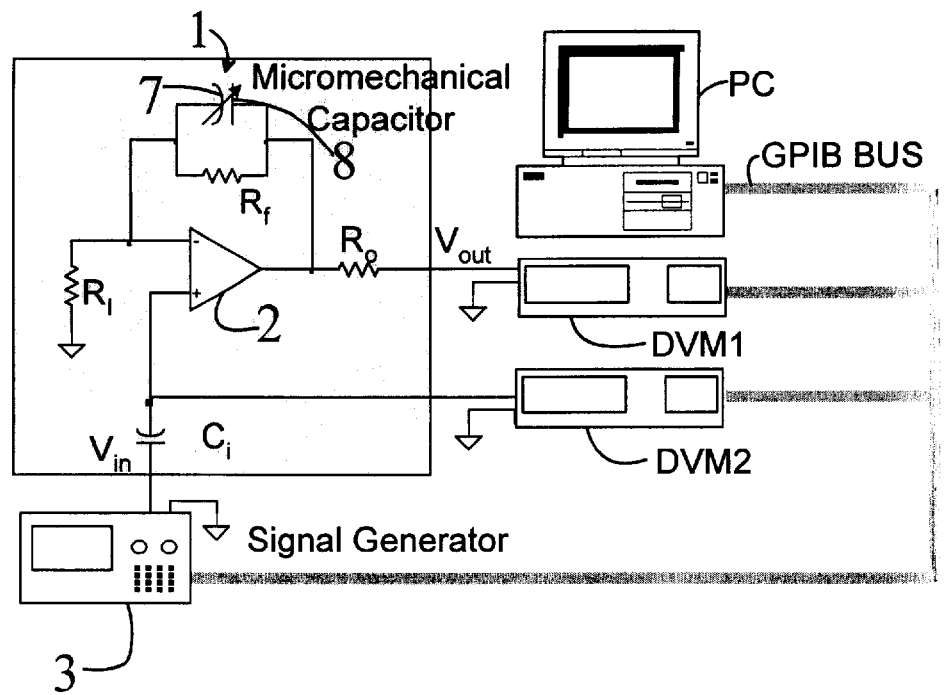
FIG. 1 shows a block diagram of an AC voltage standard according to the invention.

Accordingly, the invention relates to micromechanical AC and DC standards suited for use in miniature and cost-efficient constructions of precision electronics. The text of the present application also discusses the basic operating principle of this type of AC and DC standards as well as the preliminary tests performed on the novel standards. High-precision voltage standards are utilized in measurement equipment, for instance.

The text also describes an embodiment of an AC/DC converter based on the same mechanical basic construction.

Improved fabrication methods of silicon components (including the use of Silicon-on-Insulator, SOI, substrates) facilitate the manufacture of miniature structures from monocrystalline silicon. Such structures are mechanically extremely stable. Miniature voltage standards of high stability and cost-efficient construction can be made by combining the electrical stability of standards with the mechanical stability of SOI structures. To attain this goal, the text of this application discloses two basic concepts.

The AC voltage standard according to the invention is based on a planar capacitor having at least one of its electrodes suspended in an elastic manner on the surrounding structures this making said electrode movable in regard to the other structures. In an ideal moving-plate capacitor (MPC) having planar electrodes, the capacitance is $C=\epsilon A/(d-x)$, where x is the deviation of the moving electrode (ME) from its static position under electrostatic forces and $(d-x)$ is the interelectrode distance. The displacement of the moving electrode ME is determined by the equation of a forced harmonic oscillator:

$$m\frac{d^2x}{dt^2} + \lambda\frac{dx}{dt} + kx = F_{el}, \qquad (1)$$

written using the symbols according to the standard convention of physics. If a sinusoidal current $i=\hat{i}_0 \sin \omega t$ is passed via a capacitor, the charge of the capacitor is $q=(\hat{i}_0/\omega)(1-\cos \omega t)+q_0$, where $q_0$ is the capacitor charge at instant $t=0$. The electrostatic force between the planar electrodes is $F_{el}=q^2/(2\epsilon A)$. Then, the exact steady-state solution of Eq. (1) is $$x = \frac{q\omega^2}{2\epsilon Ak}[1 + A(2\omega)\cos 2\omega t + B(2\omega)\sin 2\omega t], \qquad (2)$$

where $$A^{-1}(\omega) = \frac{(\delta^2-1)^2 - (\lambda/m\omega_0)^2\delta^2}{\delta^2-1} \approx \delta^2,$$

$$B^{-1}(\omega) = Q_m(1-\delta^2)^2/\delta + Q_m^{-1}\delta \approx Q_m\delta^3, \quad \text{and}$$

$$q_\omega = \hat{i}_0/\sqrt{2}\,\omega, \quad \omega_0 = \sqrt{k/m},$$

$$Q_m = \sqrt{km}/\lambda \quad \text{and} \quad \delta = \omega/\omega_0.$$

Herein, an assumption has been made that $$q_0 = -\sqrt{2}q_\omega,$$

whereby the average electrostatic energy stored in the capacitor is minimized so that the DC voltage component over the capacitor is zero. Herein, the terms containing $A(\omega)$ and $B(\omega)$ can be neglected provided that the frequency $\omega$ of the alternating control current is substantially high in regard to the mechanical resonant frequency $\omega_0$ of the capacitor, in other words meaning that $\delta \gg 1$, a condition called later in the text as a high operating frequency assumption. Parallel to the term referring to the pure mechanical resonant frequency, the same variable may also appropriately called the effective mechanical resonant frequency when there is a need to indicate that the effect of a possible electrical control (e.g., through DC biasing) on the inherent mechanical resonant frequency has been taken into account.

The amplitude of the AC voltage over the capacitor is $$\hat{u}_\omega = \frac{\sqrt{2}\,q_\omega}{C_0}\left[1 - \frac{4}{27}\left(\frac{q_\omega}{C_0 u_{pi}}\right)^2\right], \qquad (3)$$

where $C_0 = \epsilon A/d$ and $$u_{pi}^2 = \frac{8}{27}kd^2/C_0.$$

From Eq. (3) can be seen that the amplitude $\hat{u}_\omega$ has a maximum value $\hat{u}_{max} = \sqrt{2}_{pi}$ when $$q_\omega = q_{max} = \pm\frac{3}{2}C_0 u_{pi}.$$

This characteristic amplitude value $\hat{u}_{max}$ can be used as a reference voltage, because a change in the value of $\hat{i}_0$ does not have a first-degree effect on the value of $\hat{u}_{max}$. If the amplitude inaccuracy of the current that causes said voltage is $\Delta\hat{i}_0$, the relative inaccuracy of said voltage at its maximum value is $$\Delta\hat{u}_\omega/\hat{u}_\omega \approx \frac{3}{2}(\Delta\hat{i}_0/\hat{i}_0)^2.$$

To verify these relationships, also the effect of the stray capacitance and the spectral purity of the current source output signal waveform were examined by the inventors using numerical simulations. In preliminary tests, measurements were performed using an AC current control system illustrated in FIG. 1, wherein the planar capacitor 1 was fabricated using surface micromechanical techniques. The tested capacitive sensor comprises a movable electrode 7 and a stationary electrode 8. An operational amplifier 2 was used as a voltage-to-current converter. The AC current to the capacitor 1 was supplied by a signal generator 3, whose output voltage was converted by a current-to-voltage converter 2 into an AC current control signal. In the actual circuit configuration, the AC current control of the sensor 1 was implemented by placing the sensor 1 on the feedback path of the current-to-voltage converter 2. The exemplifying component values in the circuit configuration of FIG. 1 were: $R_f$=22 Mohm, $R_i$=10 kohm, $R_0$=100 ohm and $C_i$=100 nF. The current passing through the capacitor 1 was estimated as $\hat{i}_0 = \hat{V}_{in}/R_1$ and the voltage over the capacitor 1 as ($\hat{V}_{out} - \hat{V}_{in}$). The measurements were performed by measuring the values of $\hat{V}_{in}$ and $\hat{V}_{out}$ when $\hat{V}_{in}$ was increased slowly. In the measurement layout, the digital voltage meters DVM1 and DVM2 and the signal generator are connected in parallel with the computer PC on an instrumentation bus (GPIP BUS). When the sensor 1 is driven into its most stable operating range by means of the signal generator 3, an extremely stable output voltage is attained suitable for use as a voltage reference signal $V_{out}$, a condition that can be verified by means of the digital voltage meter DVM1.

Figure 2:
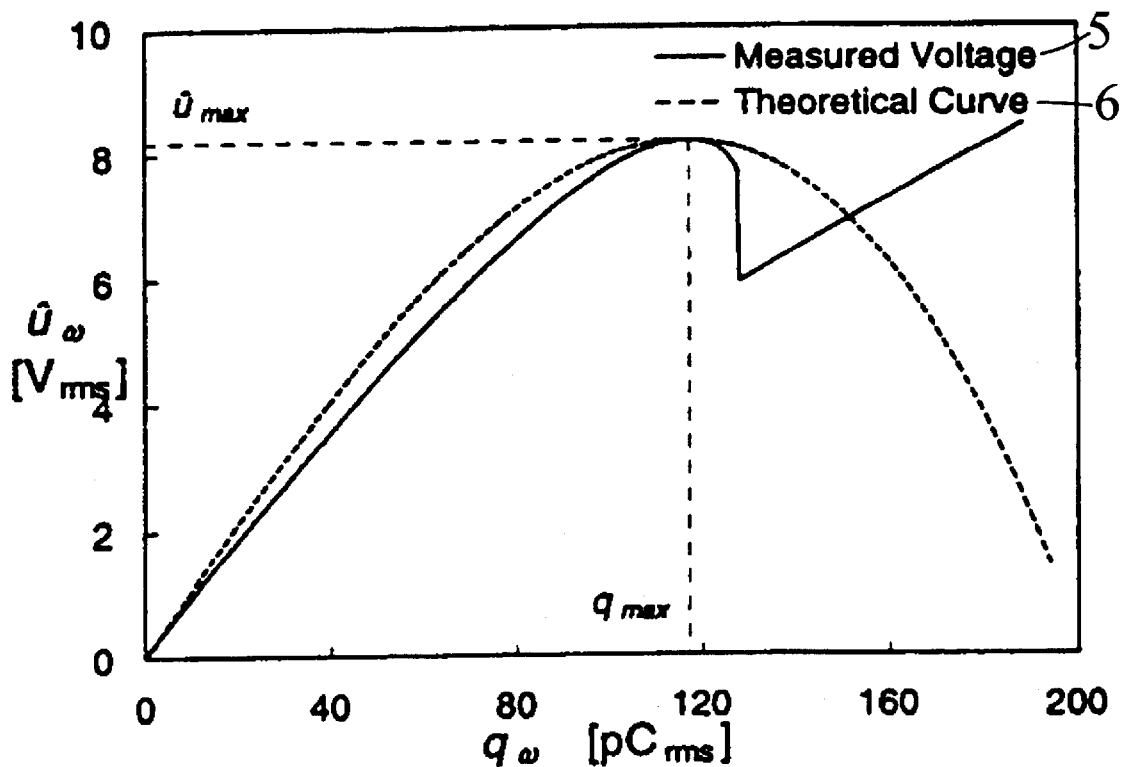
FIG. 2 shows a plot of the electrode voltage dependence on the capacitor charge as measured using the equipment illustrated in FIG. 1.

In curve 5 of FIG. 2 is shown a plot of the voltage measured over the capacitor 1 of the circuit of FIG. 1 as a function of $q_{\omega}$. Furthermore, in curve 6 of FIG. 2 is shown with a dashed line the voltage theoretically computed from Eq. (3). Curve 5 representing the measured voltage exhibits a sudden dip at $q_{\omega} \approx 130$ pC (RMS), caused by the tendency of the planar capacitor electrodes 7 and 8 to pull in until they hit the spacers made in the interelectrode space. This pull-in effect is a result of the sensor stray capacitance and the nonzero condition of the DC voltage acting over the capacitor. In order to cope with these anomalies resulting from the nonideal behaviour of the capacitor, the horizontal and vertical axes of the theoretically computed curve are scaled with correction factors having values of 0.95 and 0.80, respectively. Hence, an accurate voltage standard can be accomplished by driving the silicon micromechanical construction to operate within the flat peak of the characteristic curve plotted in FIG. 2, whereby a change in the alternating control current causes a minimal change in the voltage output used as a voltage standard.

In a static situation, the force imposed by the DC charge on the movable electrode ME is $$F_{el} = \frac{1}{2}\varepsilon A u^2/(d-x)^2 = q^2/2\varepsilon A,$$

whereby it can be computed from the equation of an equilibrium situation $$u^2 = \frac{2k}{C_0}dx(1-x/d)^2 \qquad (4)$$

that the DC voltage u over the capacitor reaches a maximum value $u=u_{pi}$ when $x=d/3$.

Figure 3:
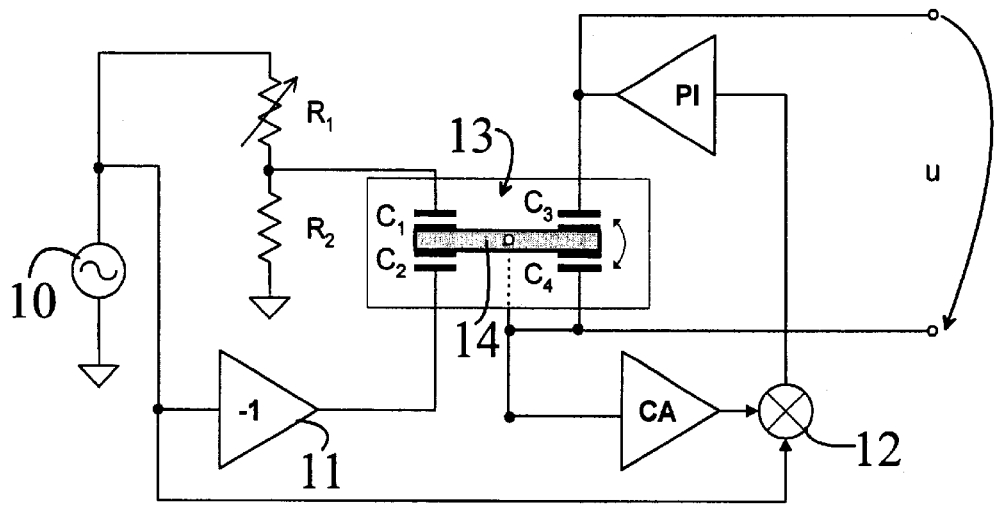
FIG. 3 shows a block diagram of a DC voltage standard according to the invention.
Figure 4:
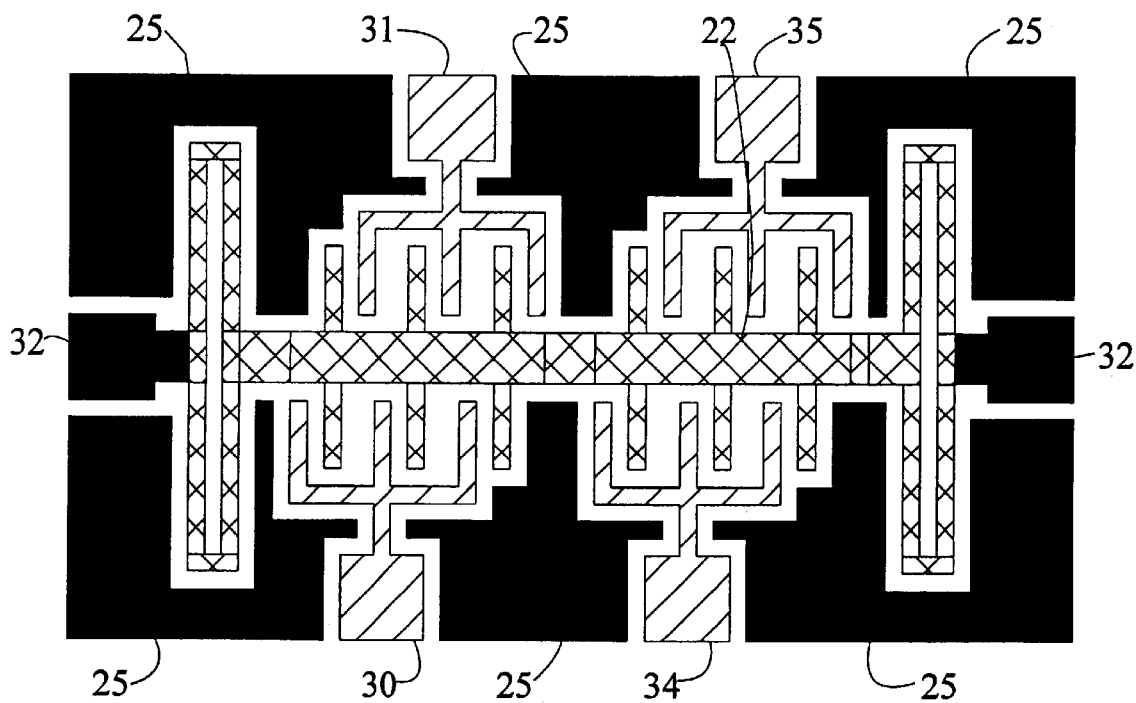
FIG. 4 shows a longitudinally sectional top view of a mechanical embodiment according to the invention, suitable for use as a DC voltage standard and an AC/DC converter.

In FIG. 3 is shown the block diagram of a DC voltage standard based on the above described concept. The mechanical structure of the standard can be implemented as shown in FIGS. 4, 5 and 6. The structure shown therein may comprise, e.g., a beam 14 connected in an elastic manner by its center to the surrounding structure so as to form a micromechanical "balance" 13. To both ends of the balance 13 are symmetrically formed four capacitors $C_1$, $C_2$, $C_3$ and $C_4$. The capacitors $C_1$ and $C_2$ are fed by a voltage source 10 so that the voltage over capacitor $C_1$ can be adjusted by resistive voltage division $R_1/R_2$ and the voltage to be applied over a balancing capacitor $C_2$ is respectively passed via an inverter 11 to the electrode of said balancing capacitor $C_2$. A feedback circuit PI controls the DC charge of capacitor $C_3$ such that sets the capacitance ratio of the capacitors $C_1$ and $C_2$ equal to the division ratio of the resistive divider ($R_1+R_2)/R_2$. The input of the PI circuit is fed by a mixer 12 whose one input in turn senses the amplitude of the signal measured by a charge-sensitive amplifier CA from the balance beam 14 at the frequency of the signal delivered by the voltage source 10. Provided that $C_1/C_2 = C_4/C_3$, in the equilibrium situation $x=rd=d/(1+2R_2/R_1)$. When the resistance of $R_1$ is increased from zero to infinite, the beam deflection changes from zero to d, and when $R_1=R_2$, the voltage u reaches a maximum value. At this operating point, the relative change of the bridge output voltage is substantially smaller than a relative change in the ratio of capacitances or in the ratio of the resistances. Herein, it must be noted that the forces imposed by the sensing currents on the capacitors $C_1$, $C_2$ cancel each other when the bridge is in equilibrium. In this manner, the stable mechanical structure allows the value of the bridge output voltage u to be used as a DC voltage reference. Obviously, the bridge output voltage u needs to be detected by a suitable circuitry not shown in the diagram.

On the same principle, it is further possible to construct DC and AC voltage standards based on a mechanical resonant frequency shift occurring in micromechanical oscillators having a high Q factor.

In a practicable embodiment, such standards may additionally need a supplementary circuit arranged to perform a continuous search for the maximum voltage peak of the operating curve.

The embodiment according to the invention may also be used as an integrated circuit, whereby external means for output voltage detection are redundant.

In FIGS. 4, 5 and 6 are shown the structure and electrical circuit configuration of an AC/DC converter embodiment.

Figure 8:
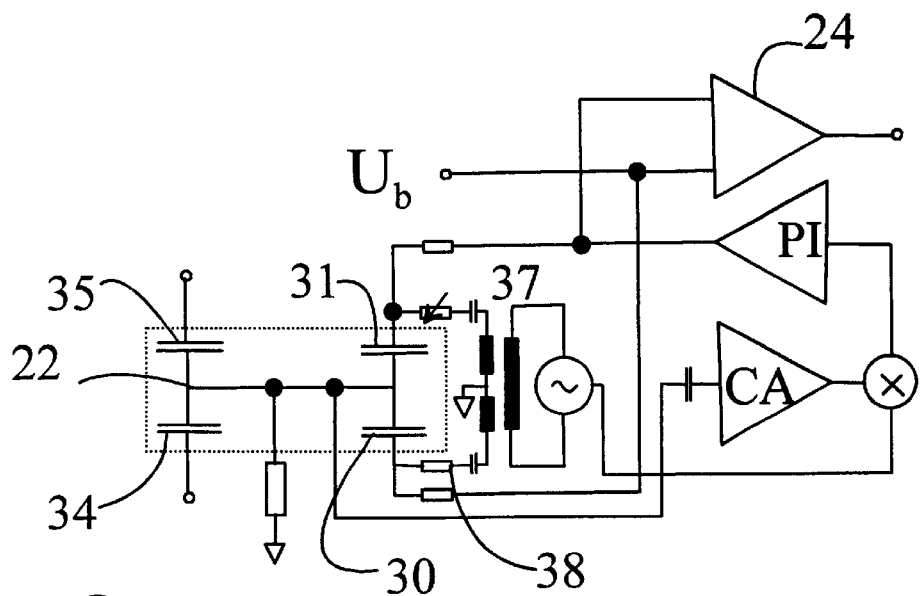
FIG. 8 shows a circuit configuration suitable for use in conjunction with the systems illustrated in FIGS. 4 and 5 for resetting the quiescent operating frequency and controlling the rest position of the system.

Using the micromechanical constructions illustrated in FIGS. 4, 5 and 6, both an AC/DC converter and a DC voltage standard can be realized. In FIGS. 7 and 8 is shown the electrical circuit configuration of an AC/DC converter that is basically similar to the above-described DC voltage standard.

As shown in the diagrams, an AC/DC converter compares the electrostatic forces imposed by both the DC and the AC voltages, and thereby, the effective values of both voltages to each other. The DC voltage is taken to electrode 34 and the AC voltage to electrode 35. The electrodes 30 and 31 are used for sensing the position of the elastically suspended balance beam 22. If the electrostatic forces imposed by the applied voltages are not equal, the beam 22 moves (cf. FIG. 4) or, alternatively, rotates (cf. FIGS. 5 and 6) by a distance that is proportional to the difference between the imposed forces. In the illustrated embodiment, a force-feedback arrangement is used in which the beam 22 is equilibrated and the difference of the opposing forces is sensed from the feedback force required to maintain the equilibrium. The electrical ground potential plane is denoted by reference numeral 25.

The micromechanical structure shown in FIG. 4 can be fabricated, e.g., on a SOI substrate by material etch-away so that a structure 22 is formed capable of elastically moving in the plane of the substrate, said movable structure having four comb electrodes made thereon for the purpose of position control and sensing. The ends of the movable structure are mechanically anchored on suspension members 32. In FIG. 4, the movable structure 22 fabricated free from its substrate and the suspension member 32 of the structure are denoted by a different pattern vs. solid color. The electrode structure is made such that the electrostatic force acting, e.g., between the electrode 30 and the beam 22 tends to move the beam in a direction opposite to that imposed by the electrostatic force acting between the electrode 31 and the beam 22. Similarly, electrodes 34 and 35 effect forces opposing each other.

Another embodiment of an equivalent micromechanical structure is shown in FIGS. 5 and 6. Herein, the electrode movement is not linear but torsional. The movable beam is mechanically anchored on a suspension member structure 32. Electrodes 30, 31, 34 and 35 are patterned on an insulating substrate such as glass.

Obviously, the geometry and layout of the electrodes may be varied from those shown in the exemplifying embodiments. An essential property of the construction is that the forces imposed by the AC and DC electrodes on the movable structure are arranged to act substantially opposite to each other.

In FIG. 7 are shown the electrical connections of an AC/DC converter made to the electrodes 34 and 35 forming the force balance construction. When the outputs of a two-position quad switch 36 are toggled to the right-side quad group of conductors, the DC voltage source 17 is switched to electrode 34 and the AC voltage source 18 to electrode 35. The DC voltage is sensed on conductor 19 and, respectively, the AC voltage on conductor 20. Using separate feed and sense lines, the effect of conductor resistance can be eliminated. Next, when the quad switch 36 is toggled to the left-side quad group of conductors, the roles of the electrodes 34 and 35 are reversed. By toggling the position of the quad switch 36 in this manner, the effect of parameter drift in the electronic circuitry of the measurement system and in the mechanical structure of the converter can be reduced in the AC/DC transfer comparison. The lower silicon plane 16 of the SOI substrate 15 is advantageously taken to the electrical ground potential. The electrical ground potential areas of the surface layer formed on the SOI substrate are denoted by reference numeral 25. Using a suitable design of the ground-potential layer elements, the mutual capacitive coupling between the electrodes 30, 31, 34 and 35 may be effectively reduced in the manner shown in FIGS. 4, 5 and 6.

In FIG. 8 is shown the electronics circuitry for beam position sensing. The position of the center beam 22 is advantageously sensed using a measurement frequency in the range of 10–100 MHz applied on the beam by inductive means so as to pass charges on the capacitive elements participating in the measurement. The current passed via the beam 22 to the ground potential is detected. The current via the beam is the sum of the currents passing via the capacitive elements acting as the measurement electrodes 30 and 31. The current via the beam 22 to the ground potential is zeroed by altering the DC potential applied on the measurement electrode 31, whereby the beam position is changed so as to alter the currents passing via the capacitive elements 30 and 31. Differential amplifier 24 senses the difference between the DC potentials applied on the capacitive elements 30 and 31, thus indicating the AC/DC transfer balance situation. The effect of a possible offset voltage is eliminated by measuring the output voltage in a situation when all the AC and DC voltages to be measured are set to zero.

This type of an AC/DC converter operates at AC voltage frequencies substantially higher than the mechanical resonant frequency of the beam which in typical micromechanical structures is in the order of a few kHz. The operating range of an AC/DC converter can be increased by lowering the resonant frequency of mechanically resonating components by virtue of an electrical control. This can be accomplished by applying an equal DC voltage $U_b$ to the electrodes adapted symmetrically to both sides of the beam 22. Then, the electrically controlled mechanical resonant frequency $\omega_{me}$ is $\omega_{me}/\omega_m = (1-\alpha U^{b2}/U_{pi}^2)^{1/2}$ and, at least theoretically, its value can be brought as low as to zero Hz. The constant $\alpha$ is in the order of one. For a planar capacitor, $\alpha = 16/27$.

To lower the mechanical resonant frequency, the circuit shown in FIG. 8 can be operated so that a bias voltage $U_b$ is applied to one measurement electrode 30. Then, the control loop of the circuit brings the DC potential of the other electrode 31 to the same level, whereby the mechanical resonant frequency of the beam is lowered. The resonant frequency also remains low also in a situation, in which the difference in the forces imposed by the AC and the DC voltages, as measured by the electrodes 34 and 35, causes a differential force that tends to move the beam, whereby said force is compensated for by controlling the DC potentials applied on the measurement electrodes 30 and 31 to levels different from each other.

In the embodiment shown in FIG. 8, it is essential to set $|U_b|>0$, in order to allow the force feedback to function in a situation in which the electrostatic force imposed by the charge of the electrode 34 to be greater than the force imposed by the charge of the electrode 35 and vice versa.

If the effective electrode areas of the capacitive elements or their permittivities differ from each other, the measurement currents impose a deflecting force on the beam 22. The situation can be balanced by adjusting the currents passed to the electrodes slightly different from each other. This offset can be accomplished by means of, e.g., adjusting the resistance of resistor 37 about that of resistor 38.

The beam 22 should be operated as close as possible to the electrical ground potential. Herein, problems may occur due to the series resistance of the mechanical suspension of the beam. A portion of the potential drop in the AC voltage applied to terminal 18 is lost as voltage loss over a resistance, whereby the electrostatic beam-deviating force imposed via the AC electrodes is reduced. The relative loss of the deviating force is proportional to the square of the ratio of the series resistance to the capacitive reactance. The series resistance of the beam suspension can be minimized by using a silicon material of maximally high conductivity and, when required, metallization of the beam suspension elements. The remaining portion of resistive loss in the AC voltage feed path can be compensated for by applying on the beam a small corrective voltage at 180° phase shift in regard to the AC voltage being measured.

The above-described method induces a small AC voltage component on the potential of the DC electrode, possibly also a small component of the high-frequency sensing signal used for detecting the position of the bridge. When both an AC and a DC voltage is applied between two electrodes, the time-averaged force generated therefrom can be written as $$F = \frac{\varepsilon A}{2l^2}\overline{(U_{dc} + \hat{U}_{ac}\sin\omega t)^2} = \frac{\varepsilon A}{2l^2}(U_{dc}^2 + \hat{U}_{ac}^2/2)$$

If the goal is to keep the force inaccuracy below 1 ppm, an AC voltage signal of about $10^{-3}$ $U_{dc}$ maximum can be superimposed on the DC voltage signal. As can be seen herefrom, the mixing of uncorrelated signals in this type of AC/DC converter is not a particularly serious problem. Also the electrostatic force generated by the distortion components of the AC source signal is summed on the force imposed by the fundamental frequency signal in a squared RMS voltage ratio of said components to the basic signal.

Figure 9:
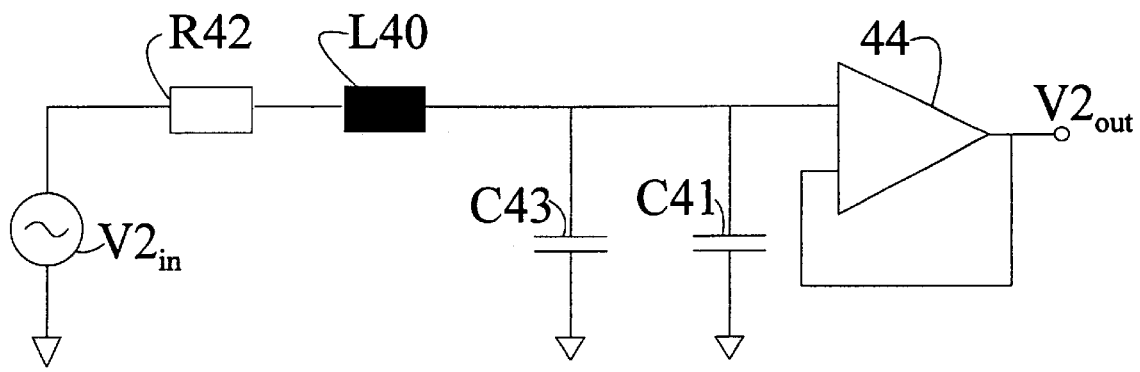
FIG. 9 shows schematically an alternative circuit configuration suitable for implementing an AC voltage standard.

In FIG. 9 is shown an alternative embodiment of an AC voltage standard. Herein, a series-connected inductor $L_{40}$ forms an electrical LC resonator with a micromechanical capacitor $C_{41}$. In the diagram, resistor $R_{42}$ represents the combination of electrical losses with possible lump resistances and output impedance of the oscillator delivering the AC control voltage $V_{2in}$. Parasitic capacitances acting in parallel with the micromechanical capacitor $C_{41}$ are denoted by a lump capacitance $C_{stray}=C_{43}$. The AC voltage $V_{2out}$ providing the accurate AC reference is detected by measuring the AC voltage acting over capacitor $C_{41}$. The circuit shown in the diagram uses a voltage-follower amplifier 44 as a buffer whose output provides the desired signal $V_{2out}$.

Using the above-described circuit, the micromechanically fabricated movable planar electrode of capacitor $C_{41}$ can be driven into a position in which the RMS value of the AC voltage applied over the capacitor attains the value $u_{pi}$ defined by Eq. (3). The basic idea herein is to select the frequency $f=\omega/2\pi$ of the AC control voltage so that when the deviation of the planar capacitor electrode is equal to the value that produces the voltage maximum, also the capacitance is driven to a value making the LC resonator to be in its electrical resonance or at least substantially close thereto. Then, small variations in the level of the control voltage have a minimal effect on the level of the AC voltage applied over the capacitor.

Provided that the earlier mentioned high-frequency assumption is valid, the RMS value of the voltage applied over the electrodes is $$\hat{u}_\omega = V2_{inRMS}/\sqrt{\omega^{2R^2C_t^2+(\omega^{...})}}, \text{ where } C_t=C_{41}+C_{43},\ C_{41}=C_0/(1-x/d) \text{ and } C_0=\varepsilon A/d.$$ Then, the electrostatic force is $$\frac{F_{el}}{kd} = \frac{4V_{inRMS}^2 C_{41}^2}{27u_{pi}^2 C_0^2} \times \frac{1}{\omega^2 R^2 C_t^2 + (\omega^2 LC_t - 1)^2}.$$

The electrical resonant frequency is $\omega_e=\sqrt{C_0/C_t}\omega_0$, where $\omega_0=\sqrt{1/LC_0}$. The quality factor Q at resonance is $Q_e=Q_0\sqrt{C_0/C_t}$, where $Q_0=\sqrt{L/R^2 C_0}$.

Figure 10:
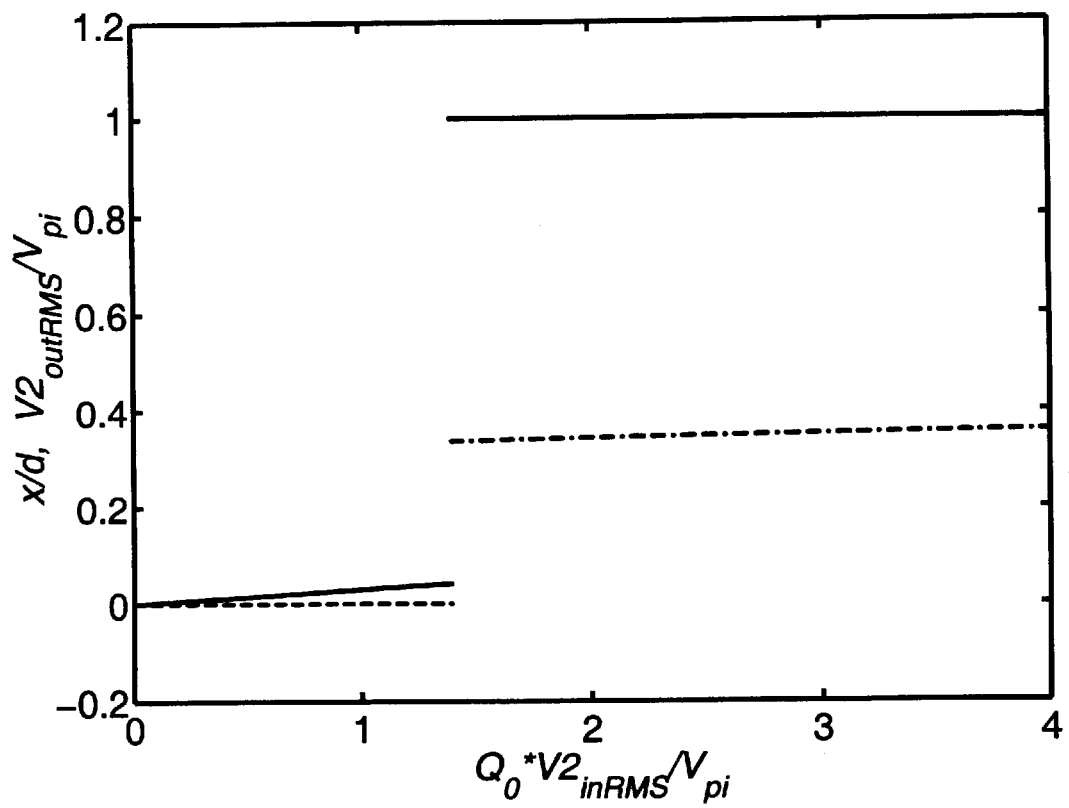
FIG. 10 is a plot elucidating the function of the circuit configuration shown in FIG. 9.

The benefits of the novel circuit can be appreciated from a computational example. In FIG. 10 is shown the amplitude $V_{2out}$ of the AC voltage measured over the planar electrodes as a function of the control voltage $V_{2in}$. Both of the plotted voltage curves are scaled relative to the pull-in voltage. Additionally, the voltage scale of the horizontal axis is multiplied by the electrical quality factor $Q_0$ of the circuit. The control voltage is applied over the resonant tuning circuit under conditions in which $\omega/\omega_0=\sqrt{2/3}$, $Q_0=\sqrt{L/C_0}/R=100$ and $C_{stray}=C_{43}=0$. In the example, the control voltage frequency $\omega$ is selected such that when the ideal moving-plate capacitor (MPC) is driven into position $x=d/3$, the resonant frequency of the tuning circuit formed by the capacitance and the inductance is just equal to the control frequency, that is, $\omega/\omega_0=\sqrt{2/3}$.

In the plot of FIG. 10, the curve drawn by a solid line represents the ratio $V_{2outRMS}/u_{pi}$ and the curve drawn by a dashed line is the ratio $x/d$. The curves are plotted by solving Eq. (1) of the dynamic movement using numerical computations, starting from a large value (larger than ≈1.38), of $Q_0V_{2inRMS}/u_{pi}$, whereby the solution is still on the broad top of the curve, that is, $x\approx d/3$, and then lowering the control voltage $V_{2inRMS}/u_{pi}$ slowly toward the zero level.

When the behaviour of the output voltage is examined on an enlarged scale, it can be seen that in the surrounding of point $Q_0V_{2inRMS}/u_{pi}\approx 1.39$ a relative change of about 1% in the control voltage close to the quiescent operating point $V_{2outRMS}/u_{pi}$ causes a change of only about 2 ppm (parts per million) in the output voltage. Hence, by selecting the quiescent operating point of the control voltage of the AC voltage standard so that operation within the range of the flat top of the operating curve can be assured, a measurement system is obtained exhibiting a minimal dependence on variations in the control voltage level. The dependence of the output voltage on the control voltage level is the smaller the closer the operating point is set to the left edge of the flat top of the operating curve. However, the operating point must be selected so that variations in the control voltage level cannot cause a shift of the operating point from the flat top occurring at point $x\approx d/3$ to the vicinity of the point $x\approx 0$.

It is obvious to a person versed in the art that the circuit configuration shown in FIG. 9 if biased to operate on the flat top of its characteristic curve may be used for stabilizing an ac voltage in the same manner as it serves to provide an accurate ac voltage standard.

What is claimed is:

1. An AC voltage reference system, comprising:
   at least one micromechanically fabricated electrode pair including a first electrode and a second electrode adapted to face each other so that the electrodes are disposed at a distance from each other, whereby at least one of said electrodes is movable against a spring force,
   means for applying an AC signal over said electrodes for establishing an electrostatic force advantageously at a frequency which is substantially higher than the effective mechanical resonant frequency of the movable electrode, and
   an apparatus for detecting the AC voltage applied between said electrodes, thus forming an AC voltage reference.

2. The system according to claim 1, wherein said electrode structure is made from monocrystalline silicon.

3. The system according to claim 1, wherein said electrode structure includes two electrode pairs connected to a bridge configuration.

4. The system according to claim 1, wherein at least one of the electrode pairs is driven by a DC signal and the other by an AC signal in order to implement an AC/DC converter.

5. An DC voltage reference system, comprising:
   at least one micromechanically fabricated electrode pair said electrode pair further including a first electrode and a second electrode facing each other so that the electrodes are disposed at a distance from each other, and at least one of said electrodes is movable against a spring force, means for applying an electrical charge between said electrodes in order to deviate said electrodes from their mutual equilibrium position, and means for detecting the DC voltage applied between said electrodes, thus forming an DC voltage reference.

6. The system according to claim 4 or wherein said electrode structure is made from monocrystalline silicon.

7. The system according to claim 5, wherein said electrode structure is includes two electrode pairs connected in a bridge configuration.

8. The system according to claim 6, wherein one of the electrode pairs is driven by a DC signal and the other by an AC signal to implement an AC/DC converter.

9. An AC/DC converter, comprising:

at least two micromechanically fabricated electrode pairs, disposed at a distance from each other so that at least one of said electrodes is movable against a spring force, means for feeding a DC signal on one electrode of said first electrode pair and means for feeding an AC signal on one electrode of said second electrode pair, and means for detecting the position of said movable electrode or, alternatively, for detecting the force required to maintain said said position of said electrode, thus accomplishing the mutual comparison of the RMS values of said applied AC and DC voltages with each other.

* * * * *